(12) United States Patent
Jeong et al.

(10) Patent No.: US 10,505,098 B2
(45) Date of Patent: Dec. 10, 2019

(54) DRIVE SIGNAL GENERATING APPARATUS

(71) Applicant: SAMSUNG ELECTRO-MECHANICS CO., LTD., Suwon-si (KR)

(72) Inventors: In Wha Jeong, Suwon-si (KR); Young Woon Choi, Suwon-si (KR); Tae Won Heo, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 562 days.

(21) Appl. No.: 15/091,995

(22) Filed: Apr. 6, 2016

(65) Prior Publication Data

US 2017/0077384 A1    Mar. 16, 2017

(30) Foreign Application Priority Data

Sep. 15, 2015  (KR) .......................... 10-2015-0130332

(51) Int. Cl.
*H01L 41/04* (2006.01)
*H02M 3/335* (2006.01)
*H02M 1/08* (2006.01)
*H02M 1/00* (2006.01)

(52) U.S. Cl.
CPC ............ *H01L 41/044* (2013.01); *H02M 1/08* (2013.01); *H02M 3/335* (2013.01); *H02M 2001/0058* (2013.01)

(58) Field of Classification Search
CPC .......... H01L 41/044; H02M 1/08; H02M 1/44
USPC ........................................................... 310/339
See application file for complete search history.

(56) References Cited

U.S. PATENT DOCUMENTS

| | | | |
|---|---|---|---|
| 7,928,634 B2 * | 4/2011 | Fang | H02N 2/186 310/339 |
| 2005/0253566 A1 * | 11/2005 | Sutardja | G05F 1/613 323/222 |
| 2006/0273688 A1 * | 12/2006 | Yasukawa | G03G 15/80 310/318 |
| 2012/0212061 A1 * | 8/2012 | Takatsuka | H01L 41/044 307/80 |
| 2012/0274132 A1 * | 11/2012 | Membretti | H02M 1/08 307/9.1 |
| 2013/0258722 A1 * | 10/2013 | Wang | H02M 1/4258 363/21.12 |
| 2014/0334192 A1 | 11/2014 | Meyer et al. | |

* cited by examiner

*Primary Examiner* — Bryan P Gordon
(74) *Attorney, Agent, or Firm* — NSIP Law

(57) ABSTRACT

A drive signal generating apparatus includes a transducer configured to convert electromagnetic energy of a signal received through a first port into a different type of energy, convert the different type of energy into electromagnetic energy, and transfer the converted electromagnetic energy to a second port, and a switching circuit configured to perform a gate switching operation, upon receiving a signal from the second port, to generate a drive signal.

5 Claims, 5 Drawing Sheets

DRIVE SIGNAL GENERATING APPARATUS

CROSS-REFERENCE TO RELATED APPLICATION(S)

This application claims the benefit of Korean Patent Application No. 10-2015-0130332 under 35 U.S.C. § 119 (a), filed on Sep. 15, 2015 in the Korean Intellectual Property Office, the entire disclosure of which is incorporated herein by reference for all purposes.

BACKGROUND

1. Field

The following description relates to a drive signal generating apparatus.

2. Description of Related Art

In general, a drive signal generating apparatus generates a signal having a specific waveform, frequency, and magnitude, and outputs the generated signal. For example, the drive signal generating apparatus supplies a signal to a switch for control of a switching operation of the switch included in a power product.

Recently, internal switching frequency of products has been gradually increasing to provide for high density/high efficiency products. Such increase in the internal switching frequency is because the sizes of magnetic elements such as inductors or transformers, a DC-link, and output terminal capacitors used in products may be reduced through the use of higher switching frequencies.

However, as the switching frequency is increased, electromagnetic interference (EMI) noise may also be increased. In order to block EMI noise, a large, complicated EMI reducing circuit may be added, making it difficult for products to have high density. Also, as the switching frequency is increased, several problems arise in designing a drive signal generating apparatus to drive switching elements used in products. First, a gate drive loss of switching elements may be increased due to the high frequency switching. Second, gate voltage noise may occur due to the high speed switching operation in switching elements. Third, gate driving characteristics of the switching elements may be affected by parasitic inductance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to a general aspect, a drive signal generating apparatus includes a transducer configured to convert electromagnetic energy of a signal received through a first port into a different type of energy, convert the different type of energy into electromagnetic energy, and transfer the converted electromagnetic energy to a second port, and a switching circuit configured to perform a gate switching operation, upon receiving a signal from the second port, to generate a drive signal.

The transducer may include a piezoelectric transformer configured to convert electromagnetic energy of the signal input through the first port into vibrational energy, and convert the vibrational energy into electromagnetic energy having a predetermined peak voltage.

The transducer may be configured to receive a first pulse signal having a first peak voltage through the first port and output a second pulse signal having a second peak voltage, the second peak voltage being converted from the first peak voltage at a predetermined ratio in a predetermined frequency band, to the second port.

The transducer may be configured to transduce the different type of energy into electromagnetic energy and transfer the transduced electromagnetic energy to a third port.

The transducer may further include a ground port connected to a ground, and a non-conductive material interposed between at least one of the ground port and the first port or the ground port and the second port.

The switching circuit may include a first transistor having a gate terminal receiving a signal from the transducer, a source terminal connected to a ground, and a drain terminal outputting a signal having a pulse waveform.

The switching circuit may include a first gate resistor directly connected between the transducer and the gate terminal of the first transistor.

The drive signal generating apparatus may further include an input signal generator configured to generate a pulse input signal having a frequency and a peak voltage and transfer the pulse input signal to the transducer, wherein an output direct current (DC) voltage of an output port of the input signal generator and an input direct current (DC) voltage of the first port may be substantially the same.

According to another general aspect, a drive signal generating apparatus includes a transformer including an input port receiving an input signal, an output port configured to output an output signal of which voltage is converted from voltage of the input signal, and a ground port connected to a ground; and a switching circuit configured to perform a gate switching operation, upon receiving signals from the output port, to generate a drive signal, wherein the ground port is electrically disconnected from the input port and the plurality of output ports.

The transformer may include a piezoelectric transformer configured to convert electromagnetic energy of the input signal into vibrational energy and convert the vibrational energy into electromagnetic energy having a peak voltage.

The transformer may be configured to receive an input pulse signal having a first peak voltage through the input port as the input signal, and output a plurality of output pulse signals to a plurality of output ports as the output signal, wherein each of the plurality of output pulse signals has a second peak voltage which is converted from the first peak voltage at a predetermined ratio in a predetermined frequency band.

A non-conductive material may be interposed between at least one of the ground port and the input port or the ground port and the output port.

The switching circuit may include first and second transistors each having a gate terminal configured to receive a signal from the transformer, a source terminal, and a drain terminal, the source terminal of the first transistor and the drain terminal of the second transistor may be configured to output the drive signal having a pulse waveform, and the first and second transistors may be configured to alternatingly turn on and off upon receiving signals through different output ports of the transformer.

The switching circuit may include a first gate resistor connected between the transformer and the gate terminal of the first transistor; and a second gate resistor connected between the transformer and the gate terminal of the second transistor.

The drive signal generating apparatus may further include an input signal generator configured to generate the input signal having a pulse waveform with a preset frequency and a preset peak voltage, wherein an output direct current (DC) voltage of an output port the input signal generator and an input direct current (DC) voltage of the input port may be substantially the same.

According to another general aspect, a high frequency switching apparatus, includes a signal generator configured to generate an electromagnetic oscillating waveform at a predetermined oscillation frequency, an electromechanical transducer coupled to a first side to the signal generator, comprising a first material abutting against a second material, and being configured to have a resonant frequency substantially corresponding with the oscillation frequency, wherein the first material is configured to receive the electromagnetic oscillating waveform and transform the electromagnetic oscillating waveform to a mechanical vibration, the second material is configured to receive the mechanical vibration and transform the mechanical vibration to an electromagnetic output, and, a switch coupled to an opposing second side of the electromechanical transducer, and being configured to receive the electromagnetic output and actuate at about the input signal frequency, substantially devoid of an electromagnetic noise interference component.

The signal generator and the switch may be directly coupled to the electromechanical transducer.

The electromechanical transducer may further include a ground connection between the first and the second material, the ground connection being configured to operate in a disconnected state substantially devoid of current.

A substantially non-conductive material may be interposed between at least one of the first material and the ground connection or the second material and the ground.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 1:
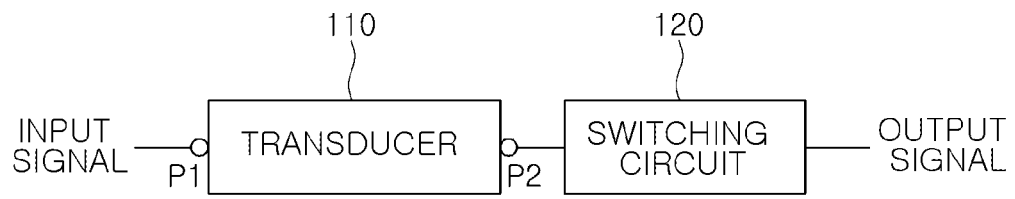
FIG. 1 is a view illustrating a drive signal generating apparatus according to an embodiment.

FIG. 1 is a view illustrating a drive signal generating apparatus according to an embodiment.

Referring to FIG. 1, a drive signal generating apparatus 100 according to an embodiment includes a transducer 110 and a switching circuit 120.

The transducer 110 transduces electromagnetic energy of a signal received through a first port P1 into a different type of energy, transduces the different type of energy into electromagnetic energy, and transfers the converted energy to a second port P2. That is, the first port P1 and the second port P2 may be electromagnetically disconnected or isolated.

Here, the different type of energy is not energy based on an electromagnetic field by inductance/capacitance, and thus, it does not generate an electromagnetic interference (EMI) signal. Transducer 110 transforms the electromagnetic energy into, for instance, an acoustic or mechanical vibration, force, torque, light, motion, temperature differential, pressure differential, chemical energy, or a positional type of energy.

This different type of energy is not affected by parasitic inductance/capacitance. Thus, the transducer 110 does not cause noise, loss, or delay due to parasitic inductance/capacitance.

The switching circuit 120 receives a signal from the second port P2 and performs a gate switching operation to generate a signal. In one embodiment, the gate switching operation refers to an operation of switching an electrical connection between the other two terminals while increasing or decreasing a voltage of a terminal of a switch. An output voltage level of the switching circuit 120 may be determined according to an ON state of the switch. For example, when the ON state of the switch is periodically changed, the switching circuit 120 generates an output signal having a pulse waveform.

In a case in which the gate switching operation of the switching circuit 120 is affected by parasitic inductance/capacitance of the switching circuit 120, the switching circuit 120 may cause noise, loss, or delay while performing the gate switching operation.

In addition, as a frequency of the gate switching operation is increased, the magnitude of noise and loss may be further increased. For example, when the magnitude of noise and loss is higher than a threshold voltage of the switch, a short circuit current may be generated in the switch. This may result in power loss and damage to the switch.

However, the switching circuit 120 is rendered free from an influence of parasitic inductance/capacitance by the provision of transducer 110. Thus, the drive signal generating apparatus 100 according to an embodiment significantly reduces noise, loss, and delay that may occur when a signal is generated according to the gate switching operation.

In addition, the drive signal generating apparatus 100 according to an embodiment smoothly performs a gate switching operation even at a high frequency. As the frequency of the gate switching operation is increased, high density and miniaturization of the drive signal generating apparatus 100 according to an embodiment may be attained.

Figure 2:
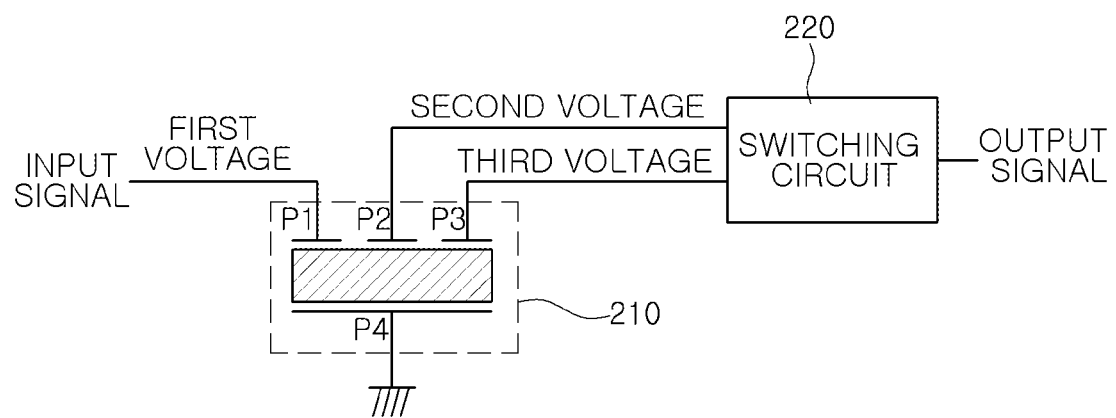
FIG. 2 is a view illustrating a drive signal generating apparatus according to an embodiment.

FIG. 2 is a view illustrating a drive signal generating apparatus according to an embodiment.

Referring to FIG. 2, a drive signal generating apparatus 200 according to an embodiment includes a transformer 210 and a switching circuit 220. Regarding the drive signal generating apparatus 200, a description of contents thereof being the same as or similar to those described above with reference to FIG. 1 will be omitted for clarity and conciseness.

The transformer 210 includes a first port P1 receiving an input signal, a plurality of ports P2 and P3 converting a voltage with respect to the input signal and outputting a converted voltage, and a ground port P4 connected to a ground. For example, the input signal may be a pulse signal having a peak voltage of a first voltage. Signals output respectively through the plurality of ports P2 and P3 are pulse signals having peak voltages of second and third voltages, respectively.

The ground port P4 is provided in a disconnected state in a conducting wire with respect to the first port P1 and the plurality of ports P2 and P3. That is, the ground port P4 may be provided with a ground voltage as a reference of a voltage with respect to the first port P1 and the plurality of ports P2 and P3, but is not provided with a current from the first port P1 and the plurality of ports P2 and P3.

When a current does not flow through a conducting wire, a magnetic field formed by the conducting wire is not present. In general, EMI noise occurs according to an interaction between an electric field based on parasitic capacitance and a magnetic field based on parasitic inductance. Thus, when a current does not flow through the conducting wire, EMI noise, loss, or delay due to the EMI noise may be prevented from occurring.

Upon receiving signals from the plurality of ports P2 and P3, the switching circuit 220 performs a gate switching operation to generate a signal. The switching circuit 220 performs an operation similar to that of the switching circuit illustrated in FIG. 1, and will not be described again here for clarity and conciseness.

Figure 3:
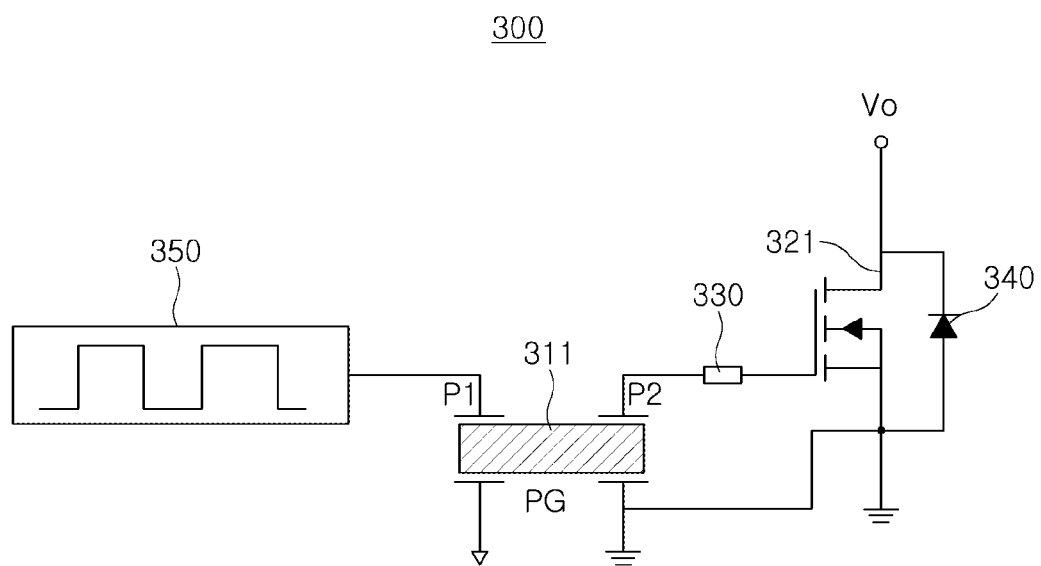
FIG. 3 is a circuit diagram illustrating the example drive signal generating apparatus of FIG. 1.

FIG. 3 is a circuit diagram illustrating the drive signal generating apparatus of FIG. 1.

Referring to FIG. 3, a drive signal generating apparatus according to an embodiment includes a piezoelectric transformer 311, a first transistor 321, a gate resistor 330, a diode 340, and an input signal generator 350. Regarding the drive signal generating apparatus 300, a description of contents thereof that are the same as or similar to those described above with reference to FIGS. 1 and 2 will be omitted here for clarity and conciseness.

The piezoelectric transformer 311 receives a pulse signal having a preset peak voltage through a first port P1 and transfers the pulse signal having a peak voltage changed at a preset ratio, in a preset frequency band, to a second port P2. During the transferring of the pulse signal, electromagnetic energy is transformed into vibrational energy and transferred, and after the vibrational energy is transferred, the vibrational energy is again transformed into electromagnetic energy.

The first transistor 321 receives a signal from the piezoelectric transformer 311 through a gate terminal, a source terminal is grounded, and a signal having a pulse waveform is generated and output through a drain terminal of the first transistor 321. For example, the first transistor 321 may be a field effect transistor (FET), a bipolar junction transistor (BJT), or other suitable transistor.

The gate resistor 330 is directly connected between the piezoelectric transformer 311 and the gate terminal of the first transistor 321. In one example, direct connection refers to connection through one or more of a conducting wire, trace, or via without a capacitor connected in series. An output voltage from the second port P2 is applied to the gate terminal of the first transistor 321 through the gate resistor 330 to cause charging/discharging of capacitance between the gate terminal of the first transistor 321 and source and drain terminals.

The diode 340 is connected between the source terminal and the drain terminal of the first transistor 321 to assist a gate switching operation of the first transistor 321. A voltage between the source terminal and the drain terminal of the first transistor 321 may be stably switched by the first diode 340.

In a state in which the first transistor 321 and the diode 340 are connected as illustrated in FIG. 3, a drain voltage Vo of the first transistor 321 is output as a negative voltage or a zero voltage during a turn-on interval of the first transistor 321 due to resonance. The drain voltage Vo is output as a positive voltage during a turn-off interval of the first transistor 321. For example, the first transistor 321 outputs a pulse signal in which a minimum voltage is a negative voltage.

The input signal generator 350 generates a pulse input signal having a preset frequency and a preset peak voltage, and transfers the generated pulse input signal to the piezoelectric transformer 311. For example, the input signal generator 350 generates a pulse input signal using a pulse transformer. In a case in which the pulse transformer provides a pulse input signal to a general transformer, a DC block capacitor may be provided in both a primary side and a secondary side of the transformer in order to prevent saturation. This may cause a problem such as an increase in an additional component and an increase in loss of gate switching.

However, in a case in which the conducting wire connection with respect to the first port P1 and the plurality of ports P2 and P3 in the ground port PG of the piezoelectric transformer 311 is cut off, a serial connection capacitor such as a DC block capacitor may be obviated between the input signal generator 350 and the piezoelectric transformer 311. Thus, the drive signal generating apparatus 300 according to an embodiment may solve a problem of an increase in additional components and an increase in loss of gate switching.

Figure 4:
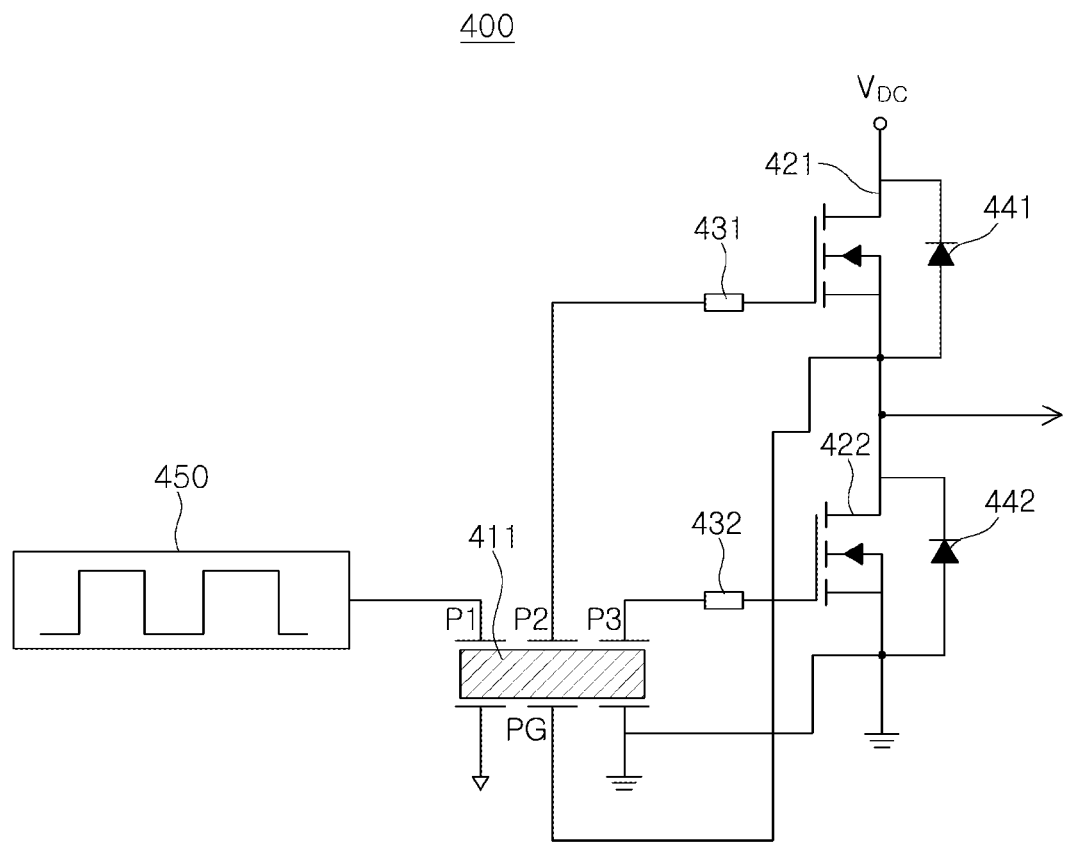
FIG. 4 is a circuit diagram illustrating the example drive signal generating apparatus of FIG. 2.

FIG. 4 is a circuit diagram illustrating the drive signal generating apparatus of FIG. 2.

Referring to FIG. 4, a drive signal generating apparatus 400 according to an embodiment includes a piezoelectric transformer 411, a first transistor 421, a second transistor 422, a first gate resistor 431, a second gate resistor 432, a first diode 441, a second diode 442, and an input signal generator 450. Regarding the drive signal generating apparatus 400, a description of contents thereof the same as or similar to those described above with reference to FIGS. 1 through 3 will be omitted here in the interest of clarity and conciseness.

The piezoelectric transformer 411 receives a pulse signal having a preset peak voltage through a first port P1 and transfers the pulse signal having a peak voltage changed at a preset ratio, in a preset frequency band, to a plurality of ports P2 and P3.

The first and second transistors 421 and 422 receive signals from the piezoelectric transformer 411 through gate terminals, while source terminals may be grounded, and a signal having a pulse waveform is output through drain terminals of the first and second transistors 421 and 422.

The first and second transistors 421 and 422 receive signals through different ports P2 and P3, respectively, of the piezoelectric transformer 411 and are alternately switched on and off.

The first gate resistor 431 is directly connected between the piezoelectric transformer 411 and a gate terminal of the first transistor 421. The second gate resistor 432 is connected between the piezoelectric transformer 411 and a gate terminal of the second transistor 422.

The first and second diodes 441 and 442 are connected between source terminals and drain terminals of the first and second transistors 421 and 422, respectively, to assist gate switching operations of the first and second transistors 421 and 422. Voltages between the source terminals and the drain terminals of the first and second transistors 421 and 422 are stably switched by the first and second diodes 441 and 442.

In a state in which the first and second transistors 421 and 422 and the first and second diodes 441 are connected as illustrated in FIG. 4, a drain voltage of the first transistor 421 and a source voltage of the second transistor 422 are output as a $V_{DC}$ voltage during a turn-on interval of the first transistor 421. The drain voltage of the first transistor 421 and the source voltage of the second transistor 422 are output as a 0V voltage during a turn-on interval of the second transistor 422 according to alternating ON/OFF state based on resonance.

The input signal generator 450 generates a pulse input signal having a preset frequency and a preset peak voltage, and transfers the generated pulse input signal to the piezoelectric transformer 411. A conducting wire between the input signal generator 450 and the piezoelectric transformer 411 may not be cut off. In that, an output direct current (DC) voltage of the input signal generator 450 and an input direct current (DC) voltage of the piezoelectric transformer 411 may be the same.

Figure 5:
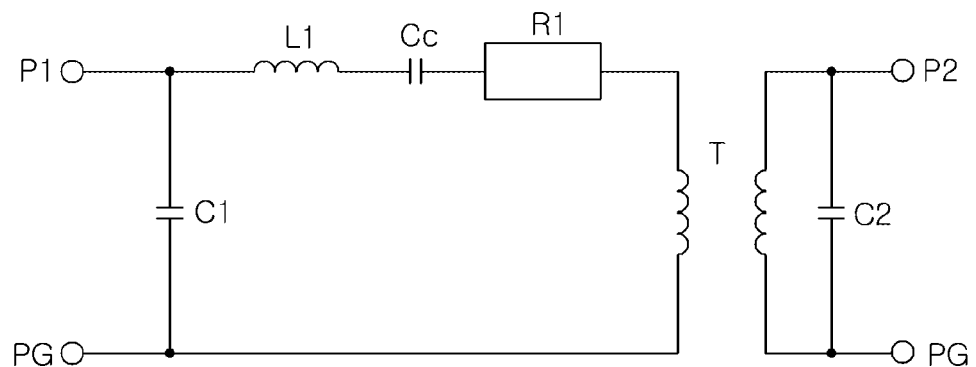
FIG. 5 is a view illustrating an electric model of a piezoelectric transformer of FIG. 3.

FIG. 5 is a view illustrating an electric model of a piezoelectric transformer of FIG. 3.

Referring to FIG. 5, a piezoelectric transformer 511 is modeled to include primary and secondary capacitors C1 and C2, a primary inductor L1, a primary resistor R1, a DC block capacitor Cc, and a transformer T.

The piezoelectric transformer 511 may have internal parameters having nonlinear characteristics which may be adaptively adjusted according to operational conditions such as a magnitude of a primary side input voltage, mechanical stress, resonant frequency, geometry, desired pass band, noise bands, and temperature. The internal parameters may be estimated by dimensions of the piezoelectric transformer 511 and a characteristic value of a ceramic material applied thereto. For example, the internal parameters are obtained through a physical measurement method, such as a short circuit test.

Also, the piezoelectric transformer 511 may have a plurality of resonance frequencies. In one example, at least one resonance frequency is adjusted to an output signal of the drive signal generating apparatus according to an embodiment.

Figure 6:
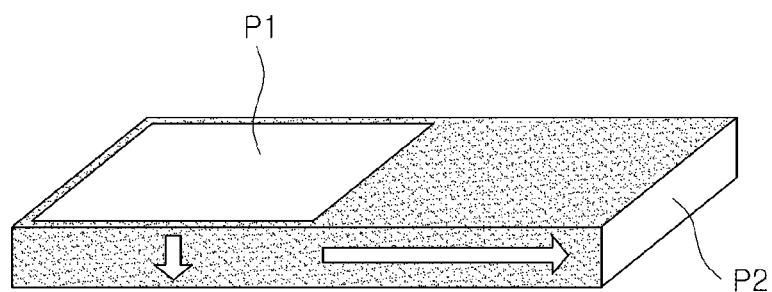
FIG. 6 is a view illustrating a transducer of FIG. 1.

FIG. 6 is a view illustrating a transducer of FIG. 1.

Referring to FIG. 6, a transducer 610 transduces electromagnetic energy of a signal received through a first port P1 into vibrational energy, transduces the vibrational energy into electromagnetic energy having a preset peak voltage, and outputs the transduced electromagnetic energy through a second port P2.

For example, the transducer 610 is configured to have various internal and external structures with a piezoelectric ceramic material, and be connected to an external circuit through primary side and secondary side electrodes. The transducer 610 is advantageous for a reduction in thickness, compared to a winding-type transformer formed of a magnetic element. As a result, application of the transducer 610 to a power product contributes to realization of a high density/miniaturized power product, leading to a more efficient manufacturing process.

Also, because the transducer 610 has operational characteristics of transducing electric energy input to the primary side into mechanical vibrational energy according to an internal structure and again generating electric energy at the secondary side, it is advantageous in that EMI noise rarely occurs. In addition, unlike the existing winding-type transformer, the transducer 610 does not require a winding for converting a magnitude of the primary side and the secondary side voltage. As a result, and in accordance with various embodiments, the transducer 610 is advantageous for mass-production and an automated manufacturing process.

The transducer 610 may be a Rosen-type piezoelectric transformer having two electrodes. For example, primary side and secondary side electrodes, and a primary side input electrode is polarized in a thickness (vertical) direction and a secondary side output electrode is polarized in a length (horizontal) direction.

In a case in which an alternating current (AC) voltage having a specific resonance frequency is applied to the primary side of the transducer 610, strong mechanical vibrations may occur at the secondary side of the transducer 610 to generate an output voltage which may be counterintuitively applied to electronic devices. Here, a ratio of the primary side input voltage and the secondary side output voltage may be determined according to a degree of coupling between the primary side and the secondary side.

The transducer 610 may have a third port provided in a position facing the second port P2. Through the additional port, the transformer illustrated in FIG. 2 may be realized.

Figure 7:
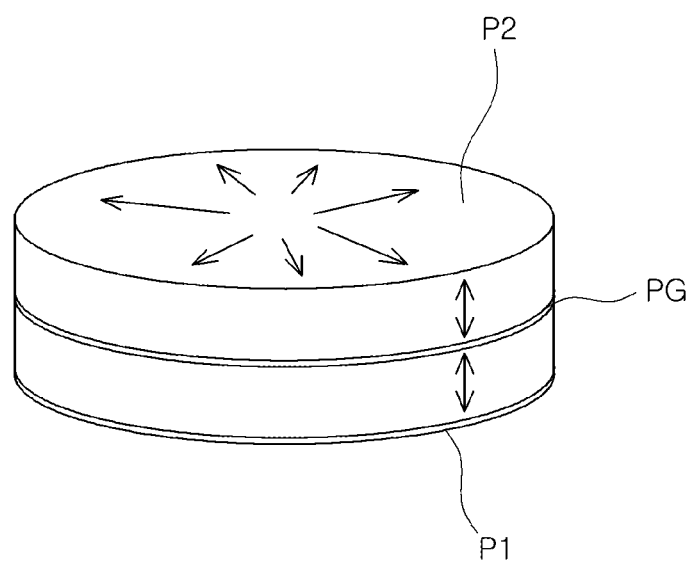
FIG. 7 is a view illustrating a transducer of FIG. 1.

FIG. 7 is a view illustrating a transducer of FIG. 1.

Referring to FIG. 7, the transducer 710 is a radial-type piezoelectric transformer in which mechanical coupling between the first port P1 and the second port P2 and an output voltage are generated due to mechanical vibrations and tension in a circumferential direction.

A non-conductive material may be interposed between the first or second port P1 or P2 and the ground port PG. For example, the non-conductive material may be air or a material having conductivity close to 0.

As set forth above, the drive signal generating apparatus according to an embodiment reduces noise, loss, and/or delay that may occur when a signal is generated according to a gate switching operation, prevent damage to the switching element, and reduce EMI, amongst other benefits.

In addition, the drive signal generating apparatus according to embodiments may be applied to a power product operating at a high frequency by solving the problem of an increase in magnitude of noise and loss according to a gate switching operation of a high frequency, and may contribute to mass-production of high density/miniaturized power products simplifying a manufacturing process and an automated manufacturing process.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A drive signal generating apparatus, comprising:
    a piezoelectric transformer comprising an input port configured to receive an input signal, first and second output ports configured to output first and second output signals of which voltage is converted from voltage of the input signal, and a ground port connected to a ground; and
    a switching circuit configured to perform a gate switching operation, upon receiving the first and second output signals from the first and second output ports, to generate a drive signal,
    wherein the switching circuit comprises a first transistor and a second transistor,
    wherein the first transistor comprises a first gate terminal configured to receive the first output signal, a first drain terminal connected to a DC voltage, and a first source terminal configured to output a first signal corresponding to the drive signal, and
    wherein the second transistor comprises a second gate terminal configured to receive the second output signal, a second drain terminal configured to output a second signal corresponding to the drive signal, and a second source terminal connected to a ground.

2. The drive signal generating apparatus of claim 1, wherein the input signal is an input pulse signal having a first peak voltage, and
    wherein the drive signal is an output signal having a second peak voltage.

3. The drive signal generating apparatus of claim 1, wherein a non-conductive material is interposed between the ground port and the input port, and/or interposed between the ground port and the first and second output ports.

4. The drive signal generating apparatus of claim 1, wherein the switching circuit further comprises:
    a first gate resistor directly connected between the first output port and the first gate terminal; and
    a second gate resistor directly connected between the second output port and the second gate terminal.

5. The drive signal generating apparatus of claim 1, further comprising:
    an input signal generator configured to generate the input signal having a pulse waveform with a preset frequency and a preset peak voltage,
    wherein an output direct current (DC) voltage of an output port the input signal generator and an input direct current (DC) voltage of the input port are substantially the same.

* * * * *